United States Patent [19]
Taylor

[11] Patent Number: 5,390,078
[45] Date of Patent: Feb. 14, 1995

[54] APPARATUS FOR USING AN ACTIVE CIRCUIT BOARD AS A HEAT SINK

[75] Inventor: Billy K. Taylor, Columbia, S.C.

[73] Assignee: AT&T Global Information Solutions Company, Dayton, Ohio

[21] Appl. No.: 113,464

[22] Filed: Aug. 30, 1993

[51] Int. Cl.⁶ .............................................. H05K 7/20
[52] U.S. Cl. .................... 361/721; 165/80.3; 174/252; 361/790
[58] Field of Search ............................ 439/69, 74, 485; 174/16.3, 252; 257/706, 707, 713, 718–720, 723, 724, 727; 165/80.3, 185; 361/690, 694, 695, 697, 704, 705, 707, 720, 721, 722, 784, 790, 796, 799

[56] References Cited

U.S. PATENT DOCUMENTS

| | | | |
|---|---|---|---|
| 4,628,407 | 12/1986 | August et al. | 361/388 |
| 4,701,829 | 10/1987 | Bricaud | 361/386 |
| 4,774,632 | 9/1988 | Neugebauer | 361/386 |
| 4,882,454 | 11/1989 | Peterson et al. | 174/68.5 |
| 4,998,180 | 3/1991 | McAuliffe | 361/383 |
| 5,019,941 | 5/1991 | Craft | 361/386 |
| 5,130,768 | 7/1992 | Wu | 357/82 |
| 5,214,570 | 5/1993 | Shah | 361/412 |

FOREIGN PATENT DOCUMENTS

| | | | |
|---|---|---|---|
| 0308943 | 12/1988 | Japan | 357/81 |
| 1122195 | 5/1989 | Japan | H05K 7/20 |
| 1132199 | 5/1989 | Japan | H05K 7/20 |

OTHER PUBLICATIONS

Multichip Packaging Ehret, IBM Tech Discl Bull vol. 14 No. 10 Mar. 1972, pp. 309.

*Primary Examiner*—Gerald P. Tolin
*Attorney, Agent, or Firm*—Paul W. Martin

[57] ABSTRACT

An apparatus and method for using a circuit board as a heat sink for another circuit board which effectively draws heat away from the other circuit board while the one circuit board is actively producing its own heat. Since the one circuit board is much larger than the other circuit board, the thermal mass of the one circuit board is great enough to absorb and spread the heat generated by both boards in the presence of forced air cooling. The method includes the steps of mounting a thermal conductivity layer on a predetermined area on the one circuit board and mounting the other circuit board over the area on the one circuit board such that components on an underside of the other circuit board firmly contact the thermal conductivity layer so as to conduct heat from the components through the one circuit board. The method may include additional steps, such as etching the predetermined area of the top surface of the one circuit board to provide a copper planar member, drilling holes through the one circuit board, and filling the holes with a conductive material to form conductive vias linking the copper planar member with a ground planar member within the one circuit board.

4 Claims, 1 Drawing Sheet

APPARATUS FOR USING AN ACTIVE CIRCUIT BOARD AS A HEAT SINK

BACKGROUND OF THE INVENTION

The present invention relates to computers and heat dissipation devices, and more specifically to an apparatus and method for using an active circuit board as a heat sink.

Printed circuit board area may be limited in a computer system. One solution for adding circuitry and components is to mount a daughter board on top of a base primary board. Components are located on the top and bottom surfaces of the daughter board.

Heat is a problem associated with the design above. Component height restrictions preclude heat sinks from being mounted to the components between the daughter board and the primary board. Conventional heat sinks do not fit on such components.

Therefore, it would be desirable to provide a method for removing heat from daughter board components.

SUMMARY OF THE INVENTION

In accordance with the teachings of the present invention, an apparatus and method for using an active circuit board as a heat sink is provided. The method includes the steps of mounting a thermal conductivity layer on a predetermined area on the one circuit board and mounting the other circuit board over the area on the one circuit board such that components on an underside of the other circuit board firmly contact the thermal conductivity layer so as to conduct heat from the components through the one circuit board.

The method may include additional steps, such as etching the predetermined area of the top surface of the one circuit board to provide a copper planar member, drilling holes through the one circuit board, and filling the holes with a conductive material to form conductive vias linking the copper planar member with a ground planar member within the one circuit board. An additional step of etching another copper planar member on the underside of the one circuit board may also be implemented.

It is a feature of the present invention that, since the one circuit board (baseboard or primary circuit board) is much larger than the other circuit board (daughter board), the thermal mass of the one circuit board is great enough to absorb and spread the heat generated by both boards when forced air cooling is provided.

It is accordingly an object of the present invention to provide an apparatus and method for using an active circuit board as a heat sink.

It is another object of the present invention to provide an apparatus and method for using an active circuit board as a heat sink which employs a thermal conductivity layer to draw heat away from components mounted on the underside of the other circuit board.

It is another object of the present invention to provide an apparatus and method for using an active circuit board as a heat sink which employs conducting vias through the one printed circuit board to a ground planar member or other planar conductor in the one circuit board.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings, in which:

DETAILED DESCRIPTION OF THE PREFERRED EMBODIMENT

Figure 1:
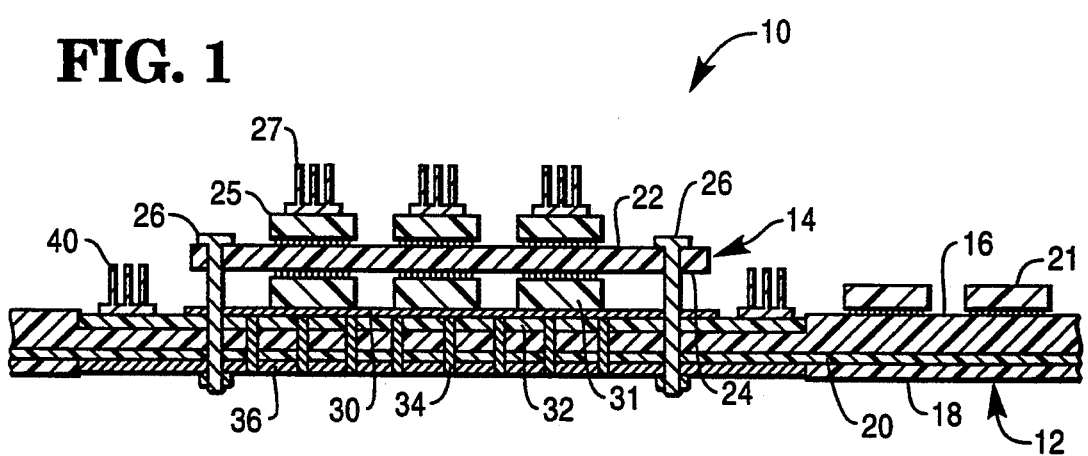
FIG. 1 is a side view of a primary board with a daughter board illustrating the method of the present invention.
Figure 2:
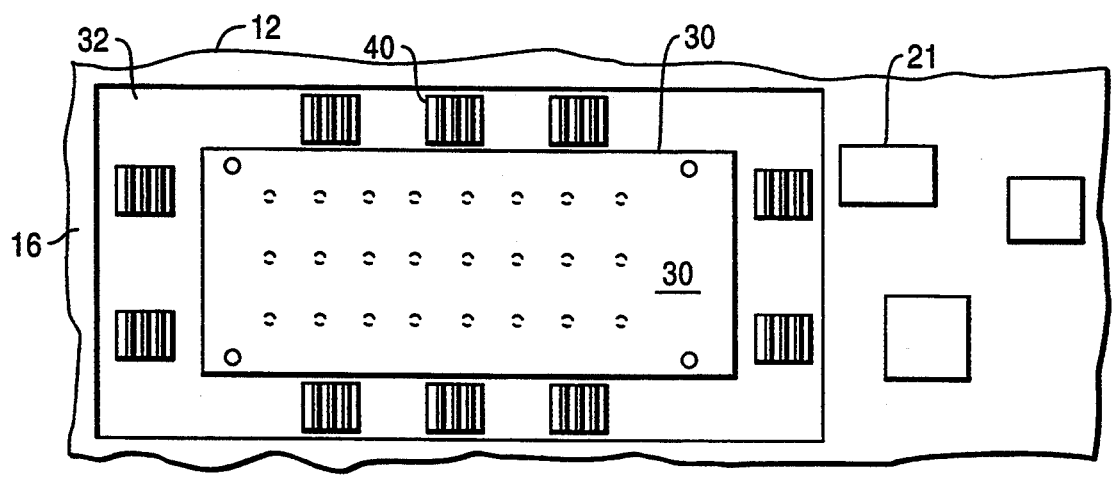
FIG. 2 is a top view of the primary board without the daughter board.

Turning now to FIGS. 1 and 2, a compact printed circuit board arrangement 10 includes primary circuit board 12 and daughter circuit board 14. Primary circuit board 12 includes a top surface 16 and a bottom surface 18. Integral to primary circuit board 12 is a ground plane 20. Primary circuit board 12 may support various types of circuitry 21 on top surface 16.

Where space is limited, primary circuit board 12 has an area in which daughter circuit board 14 is mounted. Daughter circuit board 14 may hold twice as much circuitry as the equivalent area of primary circuit board 12 because circuitry is mounted on both top surface 22 and bottom surface 24. Heat sinks 27 may be mounted to circuitry 25 on top of daughter circuit board 14. Daughter circuit board 14 may be fastened to primary circuit board 12 through bolts 26 located at each of the corners of daughter circuit board 14.

Arrangement 10 also includes a thermal conductive layer 30 on primary circuit board 12. Circuitry 31 mounted on the bottom surface 24 of daughter circuit board 14 firmly contacts thermal conductive layer 30 as bolts 26 are tightened. Thermal conductive layer 30 dissipates heat from the circuitry and the thermal mass of primary circuit board 12 acts as a heat sink to further dissipate heat. Thermal conductive layer 30 may be any such commercially available layer, such as model number A270 available from Chomerics, Inc., which is made of a siliconized elastomer.

As a further refinement, arrangement 10 includes an etched copper planar member 32 between top surface 16 and thermal conductive layer 30. Etched copper planar member 32 is produced by etching primary circuit board. Arrangement 10 may also include an additional etched copper plane 36 below ground plane 20. Etched copper planar member 32 may extend beyond the perimeter of daughter circuit board 14. Extra heat sinks 40 may be added to etched copper plane 32 around the periphery of daughter circuit board 14.

Conducting vias 34 link etched copper planar member 32 to ground plane 20 or to etched copper planar member 36, as appropriate. Vias 34 may be formed by drilling holes through primary circuit board 12 in places where no circuitry exists.

Heat from thermal conducting layer 30 is dissipated through primary circuit board 12. Since forced air or other cooling source 42 is available, the heat from primary circuit board 12 is dissipated, even though primary circuit board 12 may be active and producing heat of its own. Since primary circuit board 12 is much larger than daughter circuit board 14, the thermal mass of primary circuit board 12 is great enough to absorb and spread the heat generated by both boards in the presence of forced air cooling.

Although the present invention has been described with particular reference to certain preferred embodiments thereof, variations and modifications of the present invention can be effected within the spirit and scope of the following claims.

What is claimed is:

1. A circuit apparatus comprising:

a first printed circuit board including a first copper layer, a second copper layer below the first copper layer, and a plurality of conducting vias connecting the first copper layer to the second copper layer;

a thermal conductivity layer on the first printed circuit board;

a second printed circuit board mounted on the first circuit board and having top and bottom surfaces and including circuit elements on both the top and bottom surfaces, wherein the circuit elements on the bottom surface contact the thermal conductivity layer; and a cooling source which forces air over the first circuit board;

wherein the first printed circuit board has a thermal mass large enough to absorb heat from the second circuit board and spread heat generated from both the first and second circuit boards.

2. The circuit apparatus as recited in claim 1, wherein the second copper layer comprises a ground planar member.

3. The circuit apparatus as recited in claim 1, further comprising:

a plurality of heat sinks mounted to the first copper layer around the thermal conductivity layer.

4. A circuit apparatus comprising:

a first printed circuit board including a first copper layer and a thermal conductivity layer above and in contact with the first copper layer, an insulating layer below the first copper layer, a second copper layer below the insulating layer including a ground plane, and a plurality of conducting vias connecting the first copper layer to the second copper layer;

a thermal conductivity layer on the first printed circuit board;

a heat sink mounted to the first copper layer around the thermal conductivity layer; and a second printed circuit board mounted on the first circuit board and having a bottom surface and including circuit elements on the bottom surface, wherein the circuit elements on the bottom surface contact the thermal conductivity layer;

wherein the first printed circuit board has a thermal mass large enough to absorb heat from the second circuit board and spread heat generated from both the first and second circuit boards.

\* \* \* \* \*